(12) United States Patent
McAnally et al.

(10) Patent No.: US 12,200,912 B2
(45) Date of Patent: Jan. 14, 2025

(54) HYBRID LIQUID COOLING SYSTEM FOR A COMPUTING RACK

(71) Applicant: ZT GROUP INT'L, INC., Secaucus, NJ (US)

(72) Inventors: Andrew Lafayette McAnally, Georgetown, TX (US); Arthur Andrew Adams, IV, Cedar Park, TX (US); Macen Kanemi Shinsato, Georgetown, TX (US)

(73) Assignee: ZT GROUP INT'L, INC., Secaucus, NJ (US)

(*) Notice: Subject to any disclaimer, the term of this patent is extended or adjusted under 35 U.S.C. 154(b) by 173 days.

(21) Appl. No.: 18/158,116

(22) Filed: Jan. 23, 2023

(65) Prior Publication Data

US 2024/0251529 A1    Jul. 25, 2024

(51) Int. Cl.
*H05K 7/20* (2006.01)

(52) U.S. Cl.
CPC ..... *H05K 7/20609* (2013.01); *H05K 7/20172* (2013.01); *H05K 7/20272* (2013.01); *H05K 7/20645* (2013.01)

(58) Field of Classification Search
CPC ........... H05K 7/20781; H05K 7/20272; H05K 7/20836; H05K 7/20172; H05K 7/20772; H05K 7/20254; H05K 7/1489; H05K 7/20263; H05K 7/183; H05K 7/20609; H05K 7/20645; H05K 7/20736; H05K 7/20818; G06F 2200/201; G06F 1/20

USPC .......................................................... 361/696
See application file for complete search history.

(56) References Cited

U.S. PATENT DOCUMENTS

| | | | |
|---|---|---|---|
| 2004/0221604 A1* | 11/2004 | Ota .................... | H05K 7/20781 361/691 |
| 2013/0138253 A1* | 5/2013 | Chainer ............. | H05K 7/20781 700/282 |
| 2017/0049009 A1* | 2/2017 | Steinke ............... | H05K 7/20736 |
| 2017/0177041 A1* | 6/2017 | Shelnutt ............. | H05K 7/20809 |
| 2018/0027698 A1* | 1/2018 | Cader ................ | H05K 7/20272 165/80.4 |
| 2019/0150326 A1* | 5/2019 | Gao .................... | H05K 7/20745 361/679.47 |
| 2023/0247795 A1* | 8/2023 | Khalili ............... | H05K 7/20818 165/80.4 |

* cited by examiner

*Primary Examiner* — Mandeep S Buttar
(74) *Attorney, Agent, or Firm* — POLSINELLI PC

(57) ABSTRACT

A rack mounted cooling system operable to cool a computing system is provided. The rack mounted cooling system includes a pump unit operable to pump fluid and a plurality of heat exchangers. The heat exchangers include an input heat exchanger and an outlet heat exchanger. The input heat exchanger is operable to receive the fluid from the pump unit, lower a temperature of the fluid, and provide the fluid to a liquid cooled computing unit. The outlet heat exchanger is operable to receive the fluid from the liquid cooled computing unit, lower the temperature of the fluid, and provide the fluid to the pump unit. The heat exchangers are operable to be coupled to a rack of the computing system such that the rack with the plurality of heat exchangers fits within a rack keep in area.

20 Claims, 14 Drawing Sheets

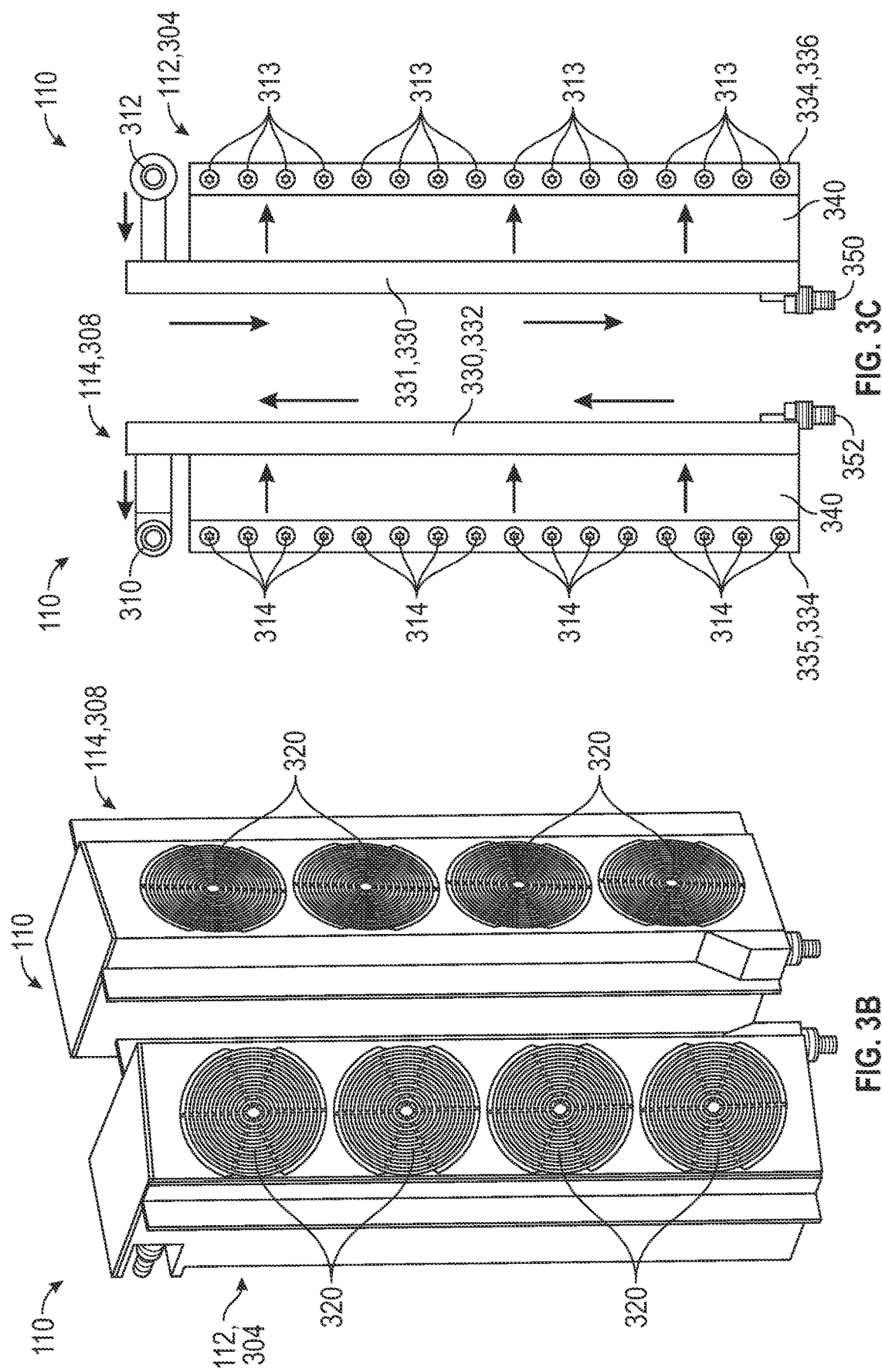

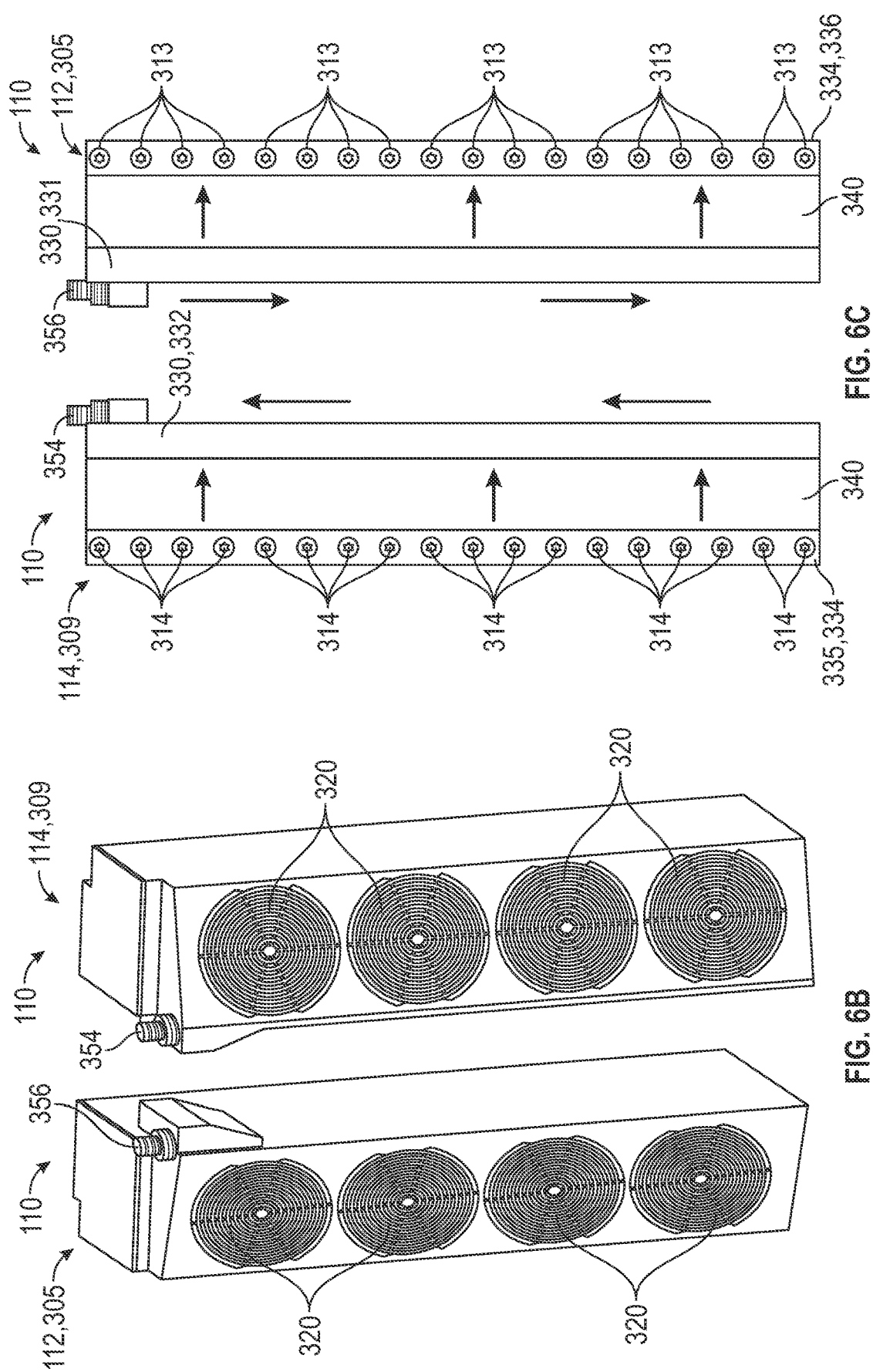

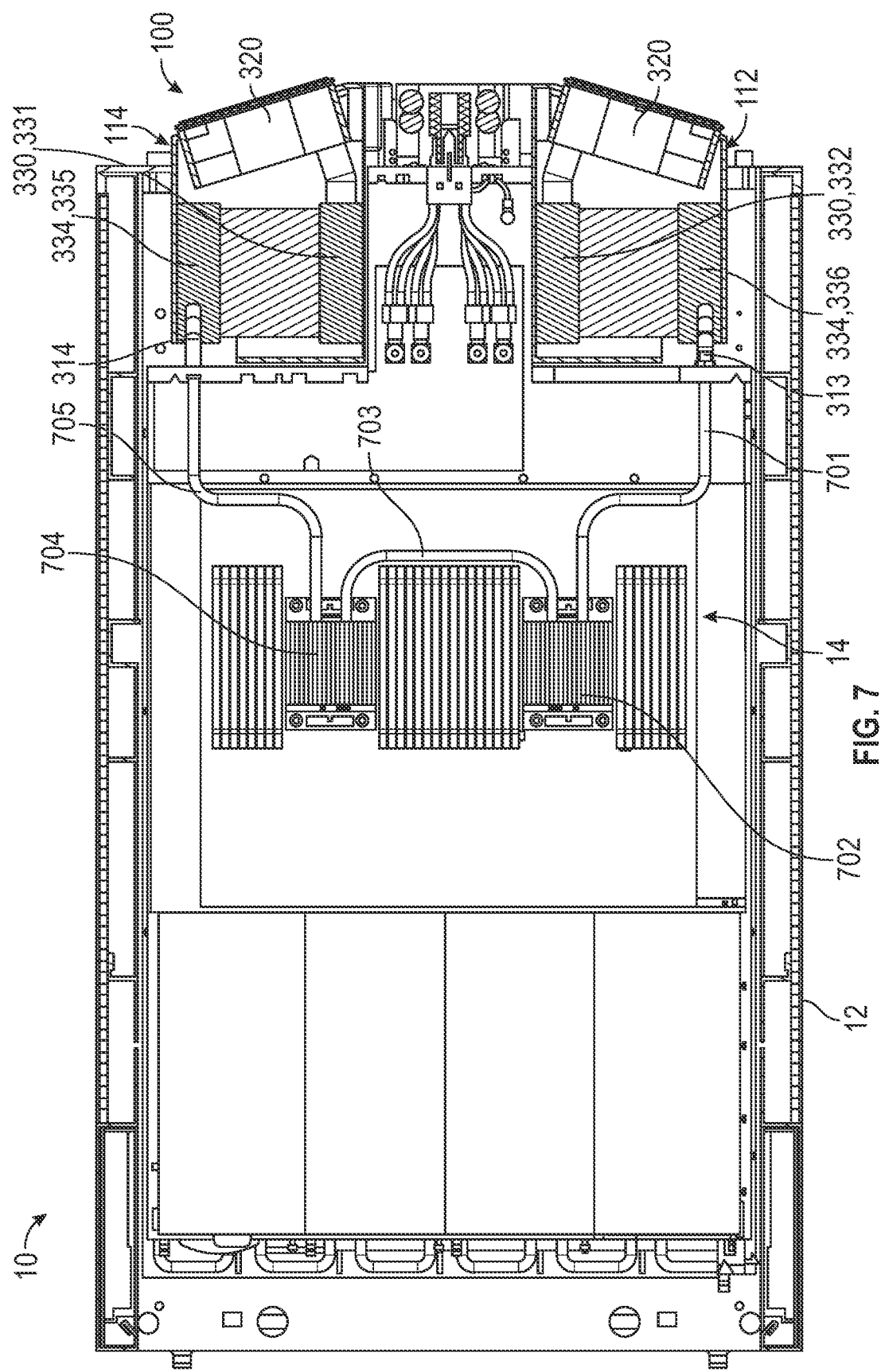

HYBRID LIQUID COOLING SYSTEM FOR A COMPUTING RACK

FIELD

The present disclosure relates generally to a rack mounted cooling system operable to be installed in a computing system.

BACKGROUND

Computing systems such as modular servers and/or information handling systems are continually improving and becoming more powerful. The chips, for example artificial intelligence chips, are becoming more powerful, which leads to increased thermal design power. To manage the heat generated by the chips, liquid cooling is becoming a main strain on the hyperscale server industry. However, the cooling systems can create issues in space constrained areas.

BRIEF DESCRIPTION OF THE DRAWINGS

Implementations of the present technology will now be described, by way of example only, with reference to the attached figures, wherein:

FIG. 3B is a rear perspective view of the upper heat exchange;

FIG. 3C is a diagram of the upper heat exchange;

FIG. 6B is a rear perspective view of the lower heat exchange;

FIG. 6C is a diagram of the lower heat exchange; and

FIG. 7 is a top cross-sectional view of the computing system.

DETAILED DESCRIPTION

Figure 1A:
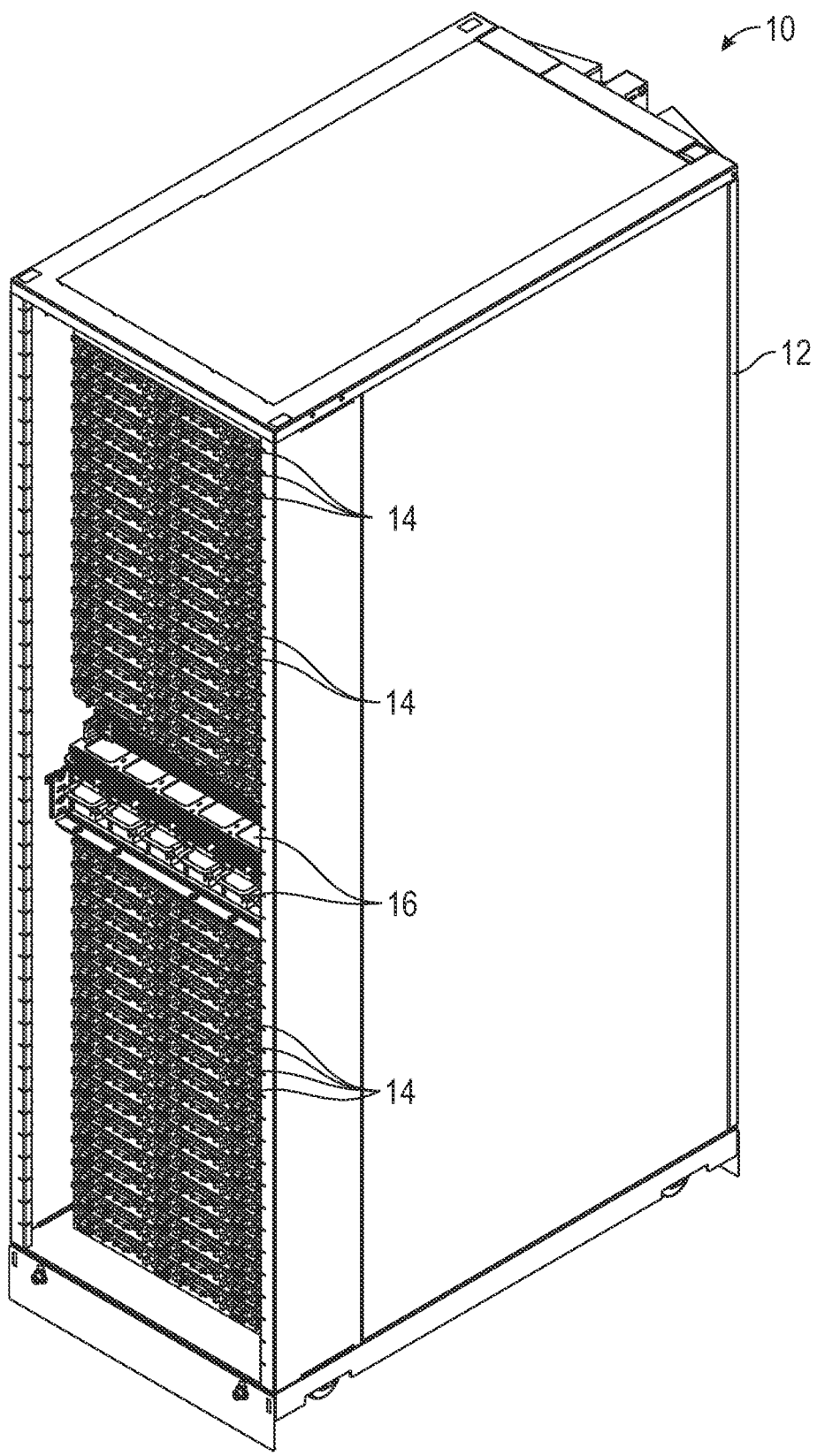
FIG. 1A is a perspective view of a computing system with a rack mounted cooling system according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

In a liquid cooled computing system, there may be limited space in a data center to contain all the extra heat exchangers and coolant pumping equipment that are required for a rack mounted liquid cooling system. Conventional liquid cooling systems can take the form of large heat exchanger systems that require additional floor space in the data center to perform the liquid cooling function. Accordingly, the rack mounted cooling system disclosed herein is contained within the footprint of the existing rack foot print and does not require additional data center floor space. Additionally, the rack mounted cooling system reduces the compute capacity of the computing system in the rack as little as possible.

Figure 1B:
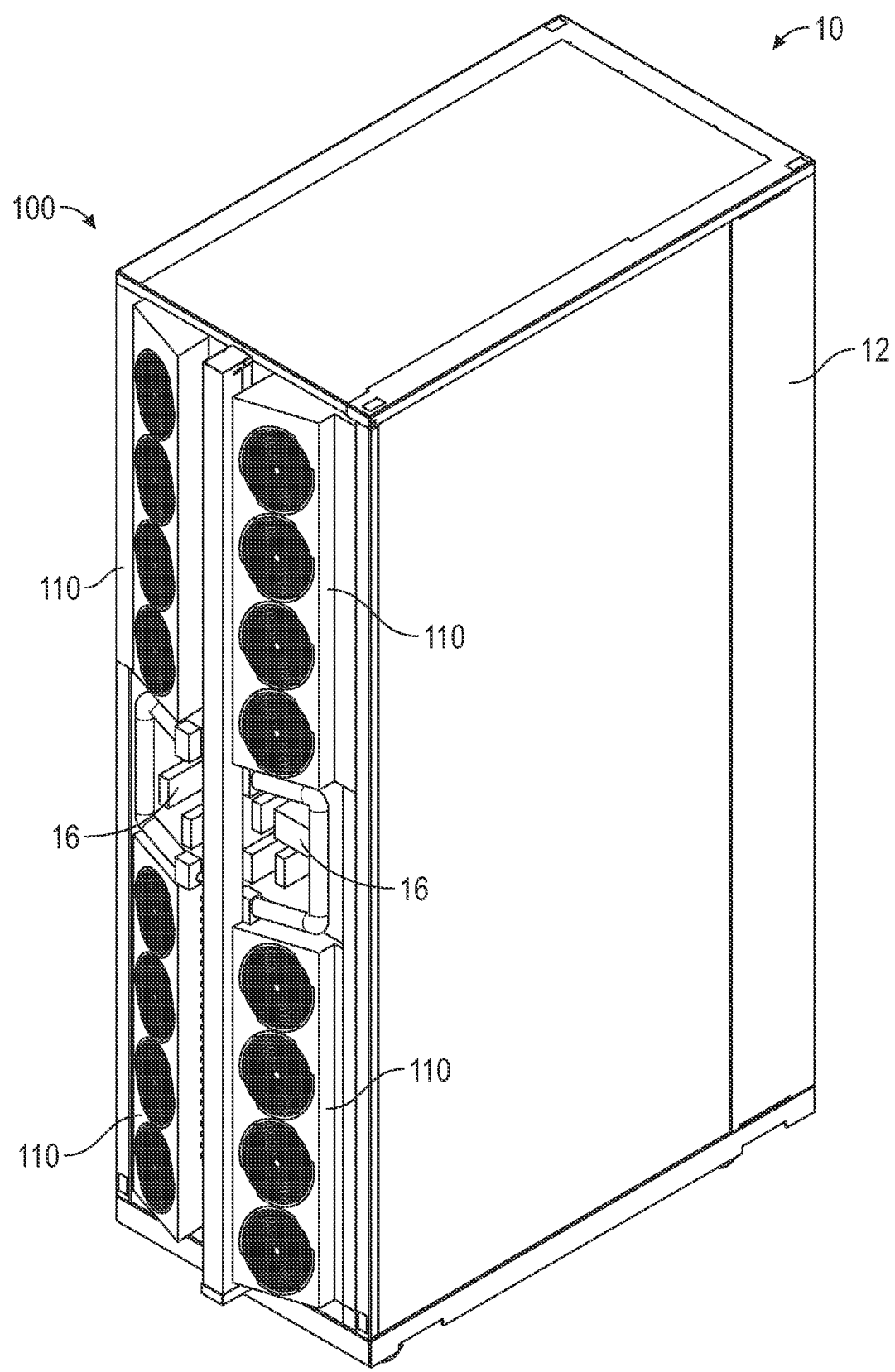
FIG. 1B is rear perspective view of the computing system of FIG. 1A.

The disclosure now turns to FIGS. 1A, 1B, 1C, and 1D, which illustrate an example of a computing system 10 to be used, for example, with a liquid cooled modular server and/or information handling system. FIG. 1A illustrates a front view of the computing system 10, and FIG. 1B illustrates a rear view of the computing system 10.

The computing system 10 can include a rack 12 operable to contain a plurality of computing units 14. Each computing unit 14 can include computing components such as any combination of one or more motherboards, one or more hard drives, one or more risers, and/or a plurality of processing units. Additional components can be disposed within the computing units 14 and/or the rack 12 without deviating from the scope of the disclosure. As illustrated in FIGS. 1A and 1B, the computing system 10 can include a plurality of computing units 14 disposed within the rack 12. As shown in FIG. 1A, the computing system 10 can include a plurality of rows of computing units 14 slotted within the rack 12. The computing system 10 can include hardware components 16 such as power components and/or control components. In at least one example, as illustrated in FIGS. 1A and 1B, the hardware components 16 may be provided in between rows of computing units 14 such that the hardware components 16 split the computing system 10 into an upper section and a lower section of computing units 14.

Thermal management of computing systems 10 and the computing units 14 can be critical to the performance and time between failures for the computing system 10. As computing units 14 in computing systems 10 such as modular servers and/or information handling systems can have higher temperature environments, air cooling can be insufficient to adequately cool down the computing systems 10. Accordingly, the rack mounted cooling system 100 utilizes heat transfer fluid to pass through the computing units 14 and lower the temperature of the computing components of the computing units 14 in the computing system 10 to within a desired threshold.

As illustrated in FIG. 1B, the rack mounted cooling system 100 can include a plurality of heat exchangers 110. In at least one example, as illustrated in FIG. 1B, the heat exchangers 110 can be provided on a rear side of the rack 12. The plurality of heat exchangers 110 are operable to manage the temperature of the computing units 14 in the computing system 10. As illustrated in FIG. 1B, the heat exchangers 110 do not cover the hardware components 16. Accordingly, the heat exchangers 110 only cover the portions of the rack 12 with computing units 14.

Figure 1C:
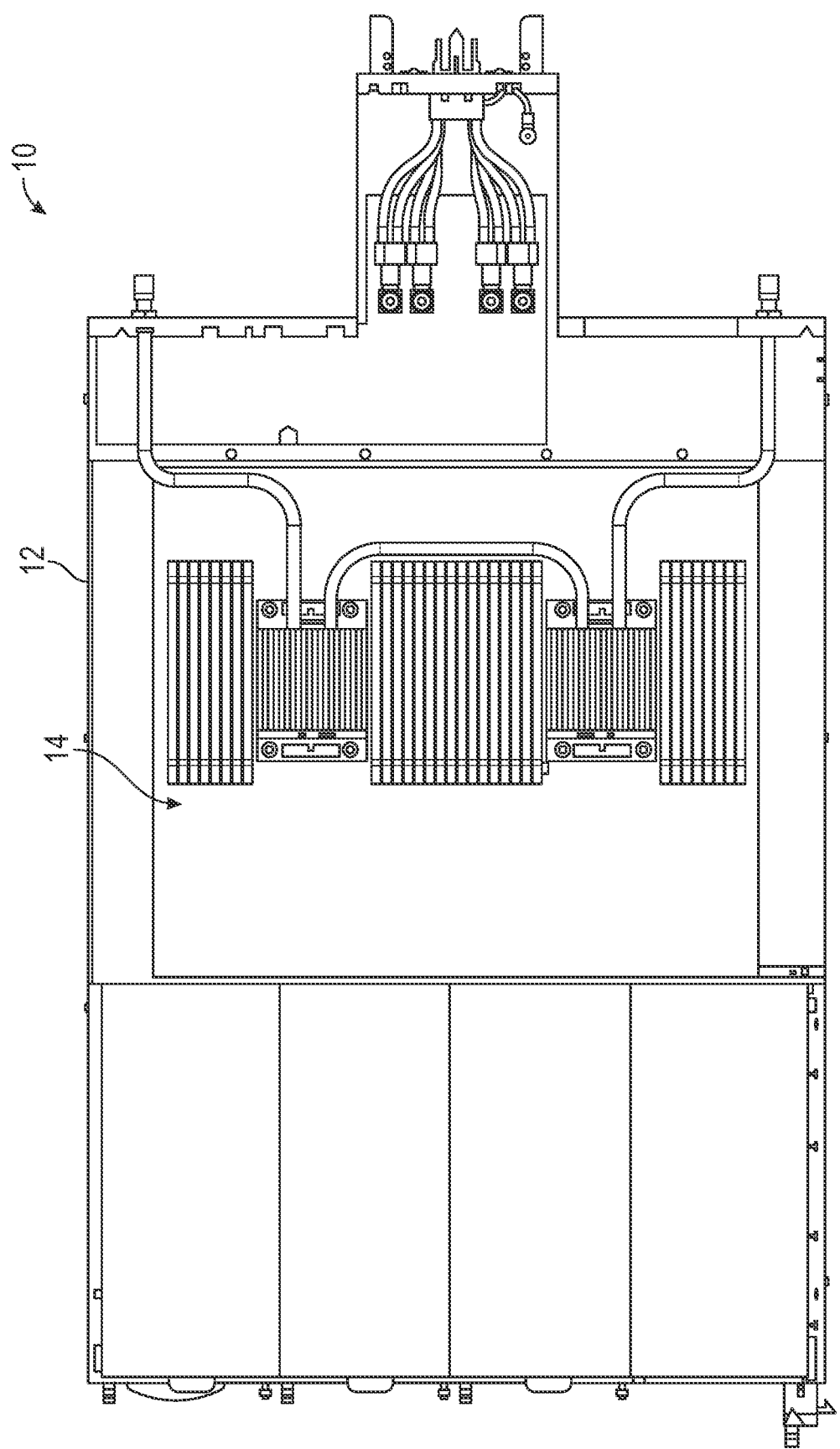
FIG. 1C is a top cross-sectional view of the computing system of FIG. 1A, omitting the rack mounted cooling system.

FIG. 1C illustrates a top cross-sectional view of the computing system 10, with the heat exchangers 110 of the rack mounted cooling system 100 omitted. FIG. 1C shows one row of the computing units 14, so FIG. 1C shows one computing unit 14 that is provided on the rack 12.

For a liquid cooled computing system 10, there is limited space in a data center to contain all the extra heat exchangers and coolant pumping equipment that are required for a liquid cooled system. Conventional liquid cooled systems can take the form of large heat exchanger systems that require additional floor space in the data center to perform the liquid cooling function.

Figure 1D:
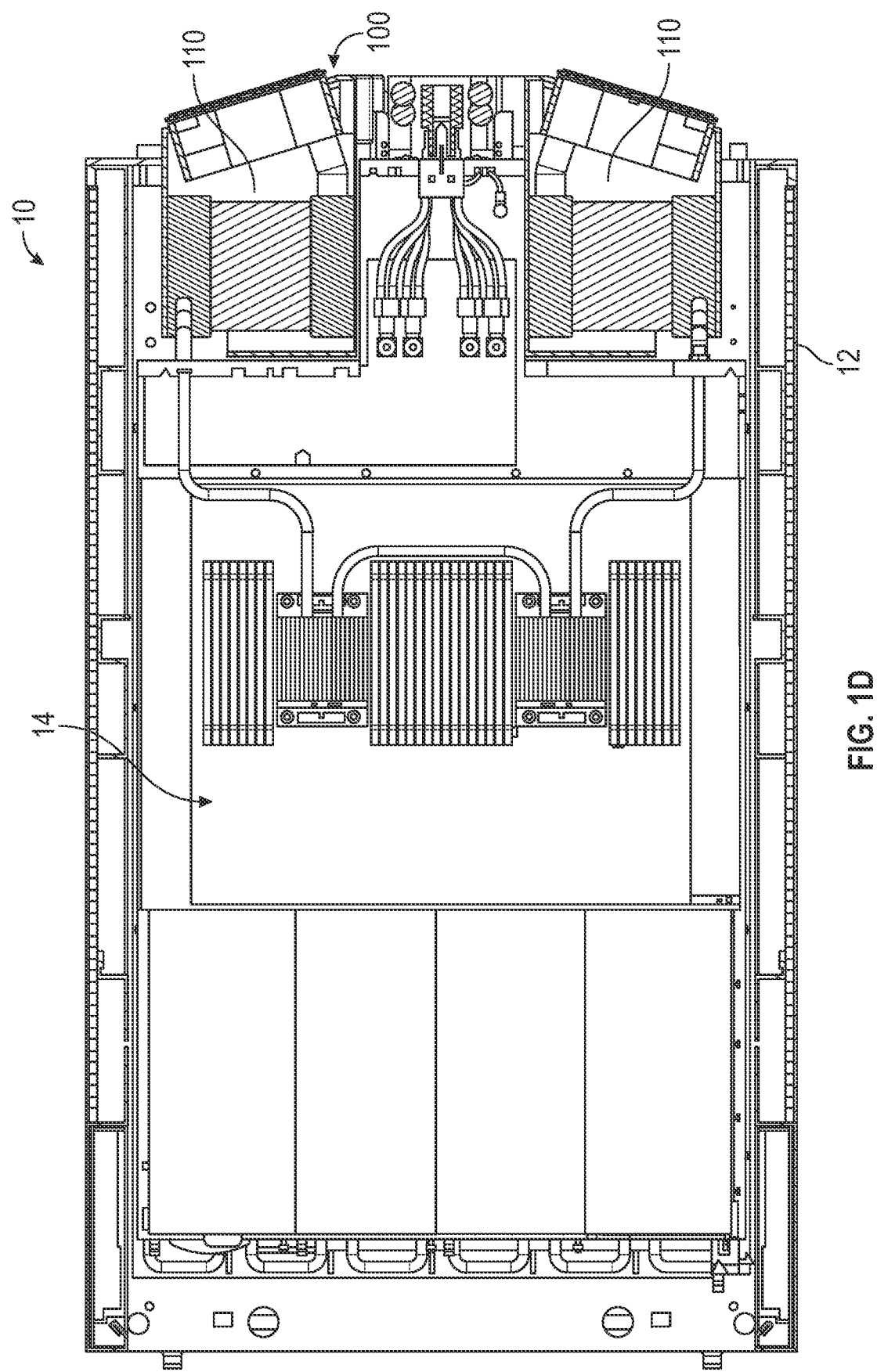
FIG. 1D is a top cross-sectional view of the computing system of FIG. 1A.

FIG. 1D illustrates the same view as FIG. 1C but including the heat exchangers 110 of the rack mounted cooling system 100. As can be seen in FIGS. 1A-1D, the computing system 10 with the rack mounted cooling system 100 as disclosed herein is contained within the existing footprint of the rack 12. In other words, the computing system 10 with the rack mounted cooling system 100 is entirely contained within a rack keep in area. Accordingly, the computing system 10 as disclosed herein can be utilized in space constrained areas while still providing sufficient cooling to the computing units 14. Additionally, the computing system 10 with the rack mounted cooling system 100 as disclosed herein provides a liquid cooling solution that is contained within the footprint of the existing rack foot print and does not require additional data center floor space, and minimizes reduction (if any) of computing capacity of the computing system 10.

In at least one example, the rack 12 can be a conventional rack, for example a central busbar rack. The heat exchangers 110 of the rack mounted cooling system 100 can be operable to be retrofit to the conventional rack so that the computing system 10 does not take up additional space in the space constrained areas, and no additional modifications or changes are needed to the conventional rack.

Figure 2A:
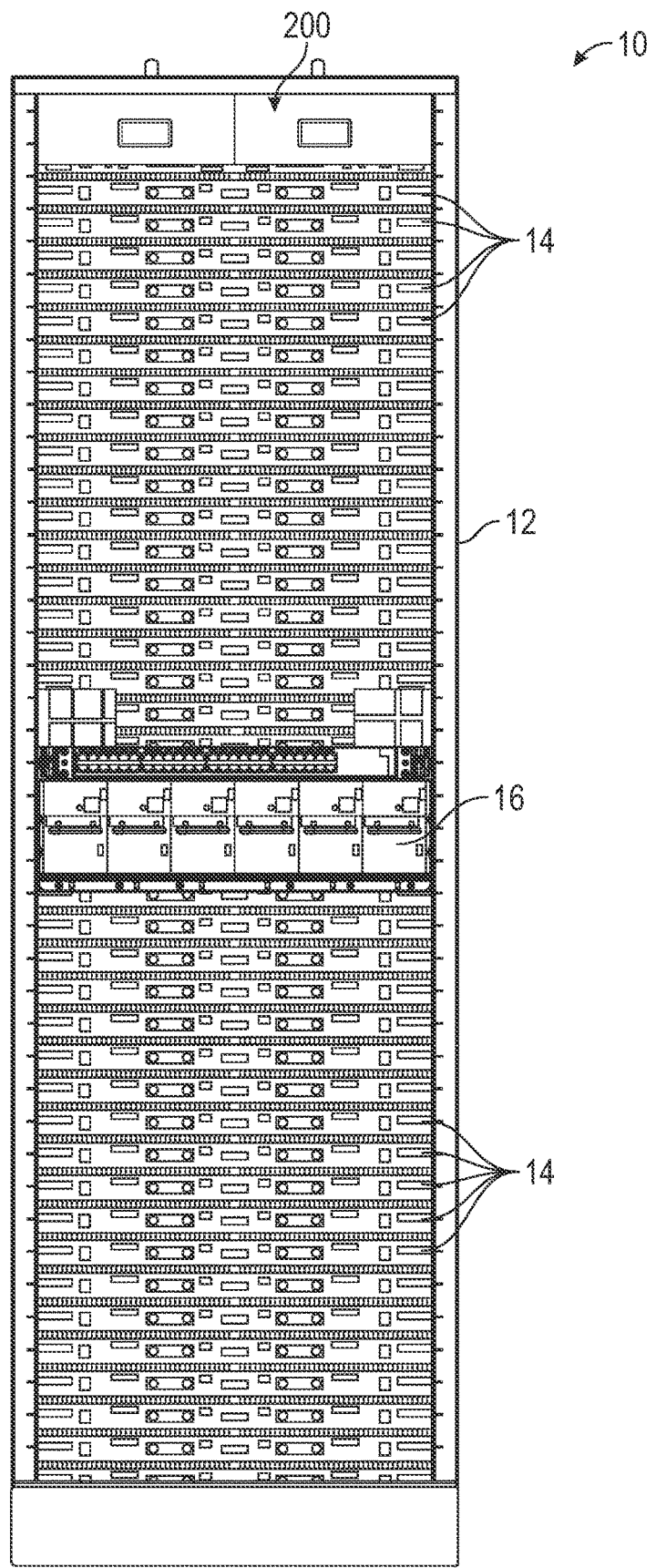
FIG. 2A is a front view of the computing system.

FIGS. 2A-2F illustrate a pump unit 200 operable to pump fluid through the rack mounted cooling system 100. As illustrated in FIG. 2A, the pump unit 200 can be positioned at or proximate to a top of the rack 12 (e.g., above the computing units 14 and/or above the heat exchangers 110).

Figure 2B:
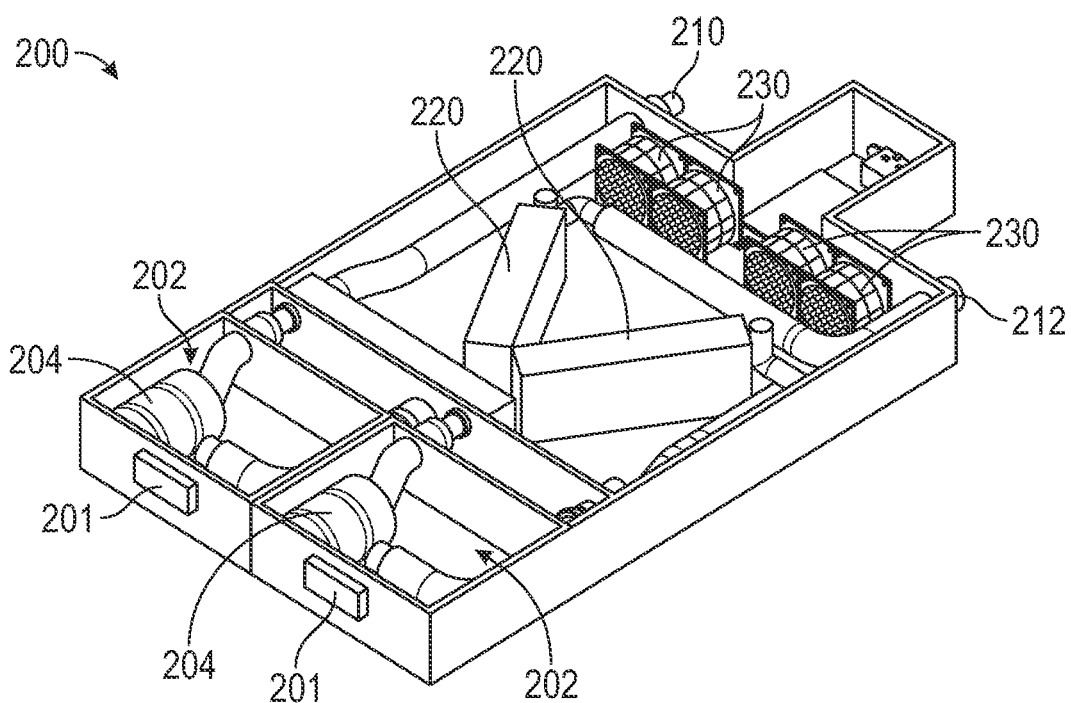
FIG. 2B is a perspective view of a pump unit.
Figure 2C:
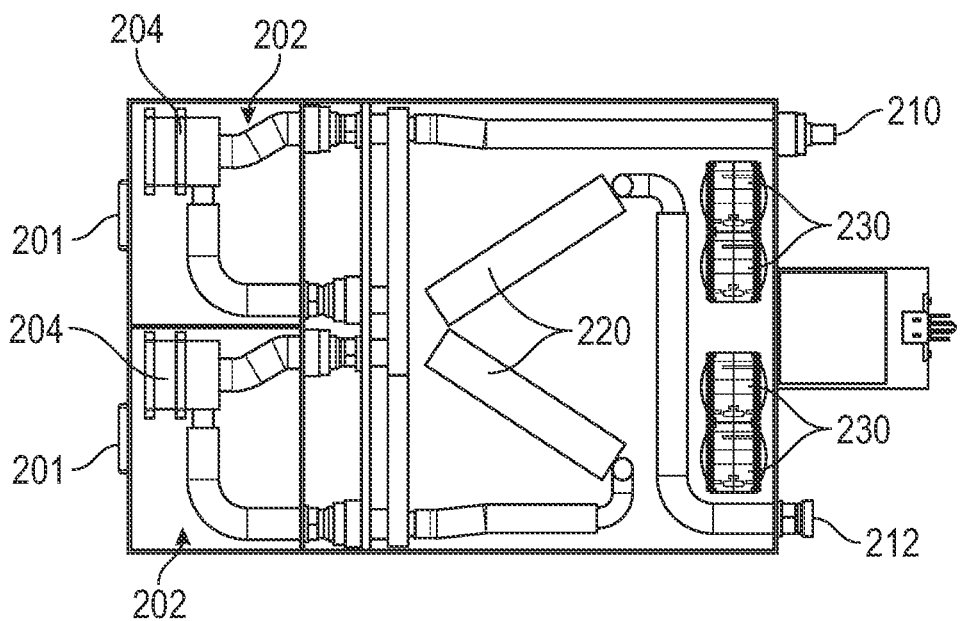
FIG. 2C is a top view of the pump unit.

Referring to FIGS. 2B and 2C, the pump unit 200 can include an inlet 210 through which fluid can flow into the pump unit 200. The pump unit 200 can include an internal heat exchanger 220 and at least one fan 230 operable to lower the temperature of the fluid as the fluid flows through the pump unit 200. The fans 230 can be operable to create air flow across the internal heat exchanger 220. As the fluid flows through the internal heat exchanger 220 (e.g., through fins or tubes), the air flow lowers the temperature of the fluid in the internal heat exchanger 220. Accordingly, the pump unit 200 also has heat exchanger capability to further manage the temperature of the fluid, and subsequently the computing system 10. The pump unit 200 can also include an outlet 212 through which fluid can flow out of the pump unit 200. The inlet 210 and the outlet 212 can be operable to fluidly couple with the heat exchangers 110 so the pump unit 200 can pump the fluid through the heat exchangers 110.

Figure 2D:
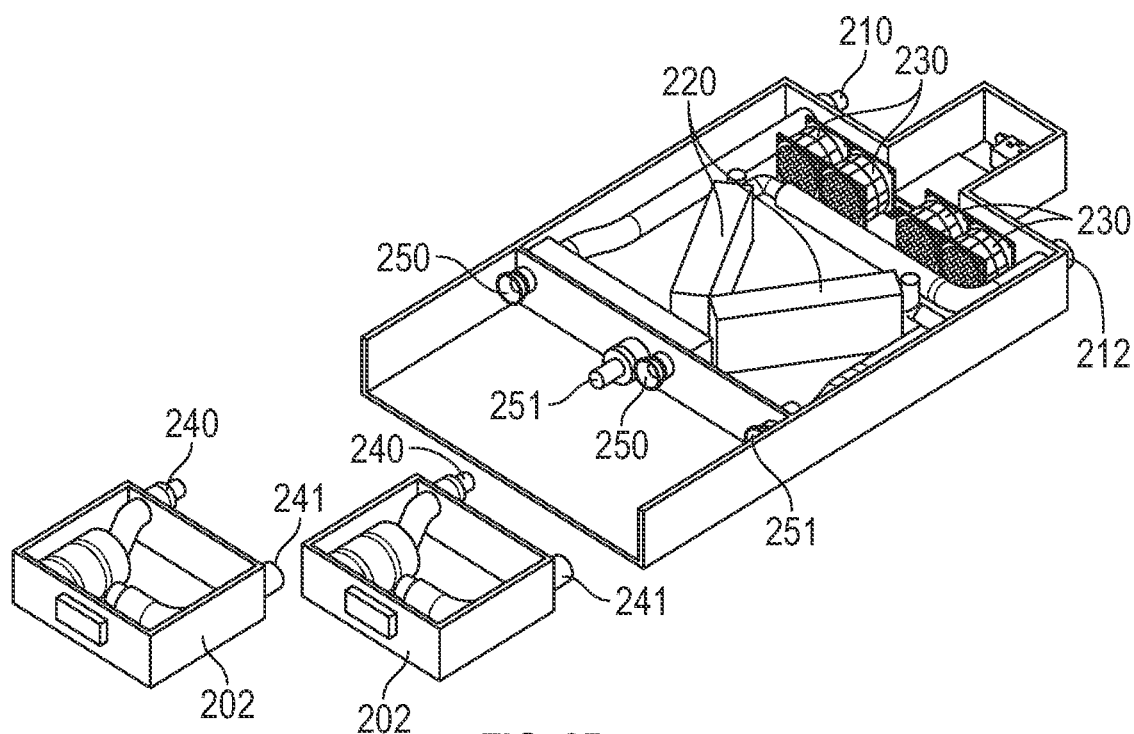
FIG. 2D is a perspective view of the pump unit, with pump modules separated.

In at least one example, the pump unit 200 can include at least one pump module 202. In at least one example, as illustrated in FIGS. 2B, 2C, and 2D, the pump unit 200 can include a plurality of pump modules 202. The pump modules 202 can each include one or more pumps 204 operable to pump the fluid. Each pump module 202 can include a control unit 201 which is in communication with the pump(s) 204. In at least one example, the control unit 201 can be operable to receive input from a user to control the rack mounted cooling system 100 (e.g., the heat exchangers 110) and/or the pump unit 200 (e.g., the pumps 204, the fans 230, etc.). In at least one example, the pump unit 200 includes one or more control units 201 that can be communicatively coupled with the pump modules 202.

In at least one example, as illustrated in FIG. 2D, the pump modules 202 can be removable. Accordingly, the pump modules 202 can be individually removed, for example for servicing. Having a plurality of removable pump modules 202 can provide redundancy. For example, as illustrated in FIGS. 2B-2D, when one of the two pump modules 202 is removed (e.g., for servicing), the other pump module(s) 202 are still attached and functioning. Accordingly, the rack mounted cooling system 100 can continue working to manage the temperature of the computing system 10.

Figure 2E:
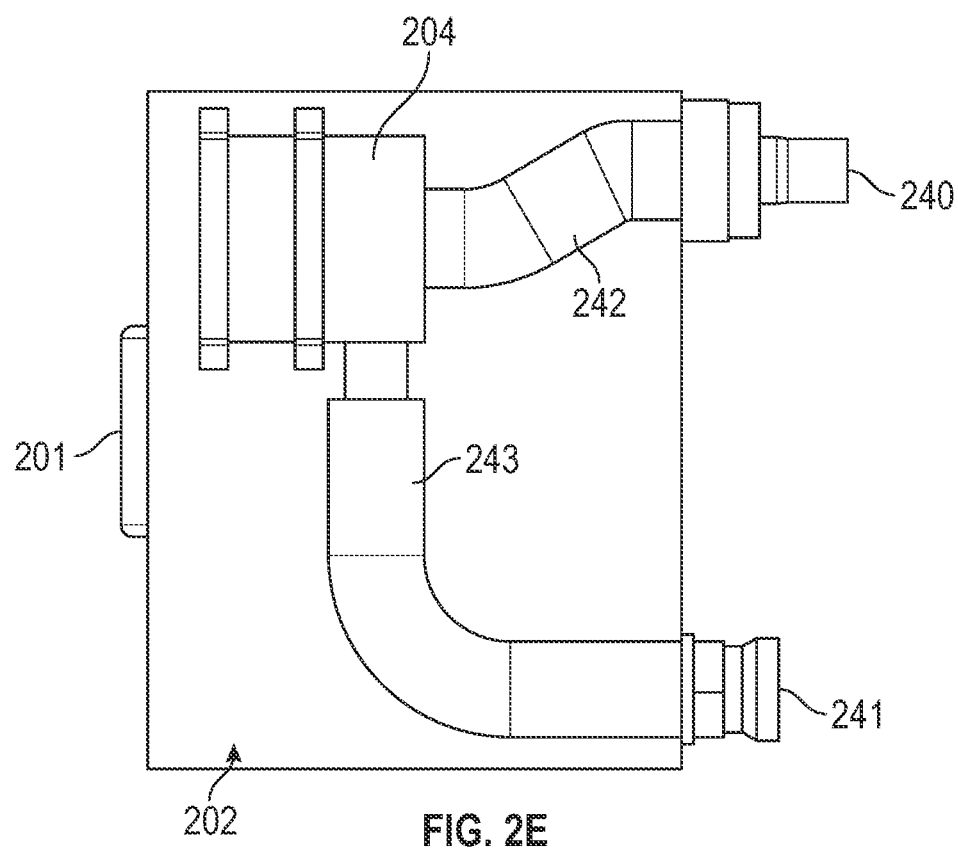
FIG. 2E is a top view of a pump module.

For example, referring to FIGS. 2D and 2E, the pump modules 202 can each include a pump inlet 240 and a pump outlet 241. The pump inlet 240 can be detachably coupled with connector 250. The pump outlet 241 can be detachably coupled with connector 251. The pump inlet 240, the connector 250, the pump outlet 241, and/or the connector 251 can be quick disconnects such that when the pump inlet 240 is disconnected from the connector 250 and/or the pump outlet 241 is disconnected from the connector 251, a valve closes to prevent fluid flow across the openings. Accordingly, leaking can be prevented with leak proof connectors when a pump module 202 is removed.

Figure 2F:
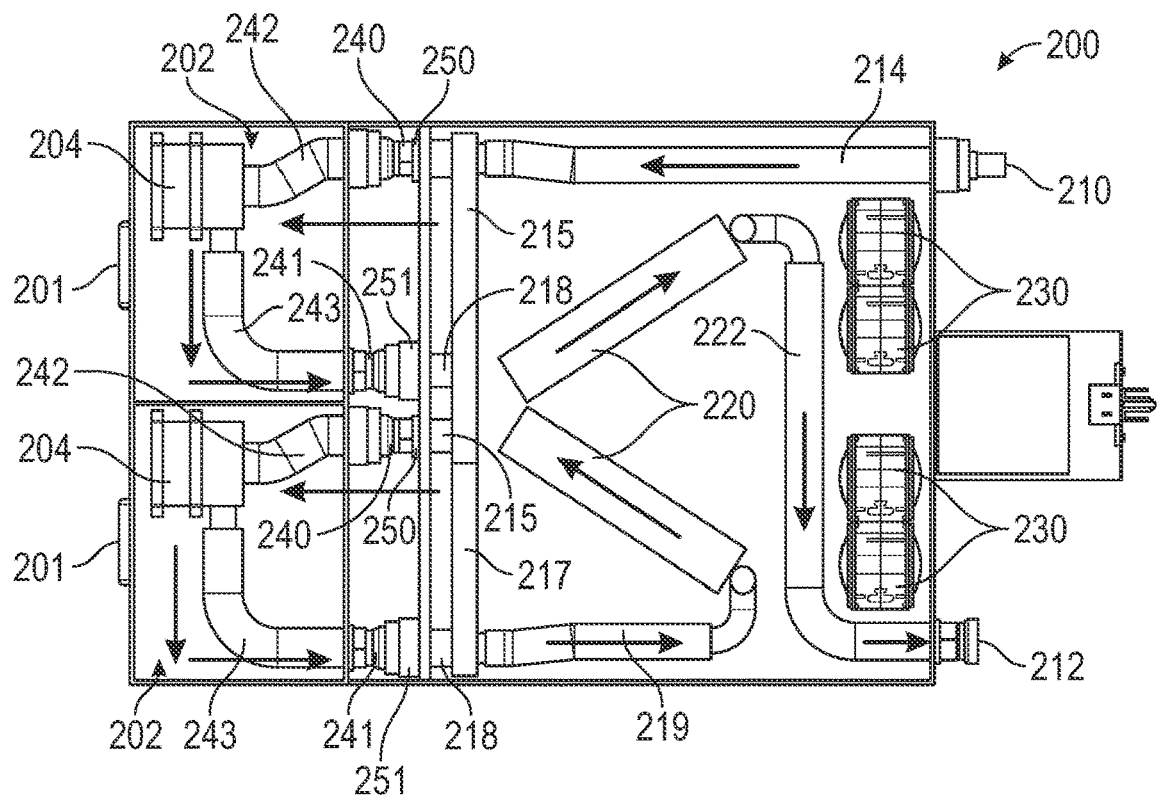
FIG. 2F is a diagram of a top view of a pump unit, showing direction of flow of fluid.

Referring to FIGS. 2E and 2F, the fluid can flow into the pump unit 200 via the inlet 210. The fluid can then flow from the inlet 210 to the connector 250 via a conduit 214. The fluid then can flow from the connectors 250 the pump modules 202 via the pump inlet 240. In at least one example, as illustrated in FIG. 2F, an inlet branch 215 can provide a split path from conduit 214 so that the fluid can flow to each of the plurality of pump modules 202. For example, the inlet branch 215 can be fluidly coupled with each of the connectors 250 that are operable to couple with the pump inlets 240 for each of the pump modules 202. The fluid can then flow from the pump inlet 240 for each of the pump modules 202 to the pumps 204 via conduit 242. The fluid flows out of the pump 204 to the pump outlet 241 for each of the pump modules 202 via conduit 243. The fluid flows out of the pump modules 202 via the connector 251 coupled with the pump outlet 241 for each of the pump modules 202. In at least one example, an outlet branch 217 can be fluidly coupled with each of the connectors 251. Outlet connectors 218 can be coupled with corresponding connectors 251, and the outlet connectors 218 can be fluidly connect the connectors 251 with the outlet branch 217. Accordingly, the outlet connectors 218 feed fluid from the connectors 251 to the outlet branch 217. The outlet branch 217 can be fluidly coupled with conduit 219 which is fluidly coupled with the internal heat exchangers 220. As the fluid flows through the internal heat exchangers 220, the temperature of the fluid can be lowered. The fluid can then flow from the internal heat exchangers 220 to the outlet 212 via conduit 222.

Figure 3A:
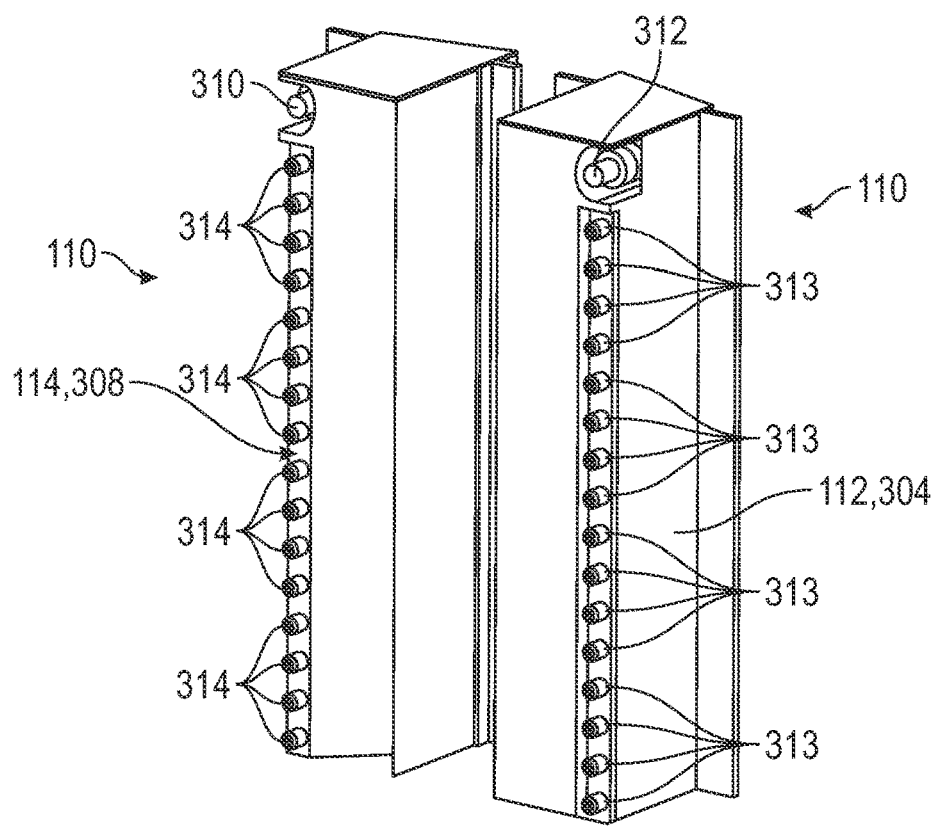
FIG. 3A is a perspective view of an upper heat exchange of the rack mounted cooling system.

FIGS. 3A, 3B, and 3C illustrate heat exchangers 110. The heat exchangers 110 are operable to fluidly couple with the pump unit 200. The heat exchangers 110 can be operable to lower the temperature of the fluid flowing therethrough. Also, the heat exchangers 110 can be operable to deliver the fluid to each of the plurality of computing units 14 to lower the temperature of the computing components of the computing units 14.

As illustrated in FIGS. 3A-3C, the heat exchangers 110 can include an input heat exchanger 112 and an outlet heat exchanger 114.

The input heat exchanger 112 can be operable to receive the fluid from the pump unit 200 (for example via the fluid coupling of outlet 212 of the pump unit 200 with the input 312 of the input heat exchanger 112), lower the temperature of the fluid, and provide the fluid to each of the plurality of liquid cooled computing units 14 in the computing system 10 (e.g., via outlet ports 313). The outlet ports 313 can correspond with each of the computing units 14 in the computing system 10. For example, the outlet ports 313 can be aligned with the corresponding plurality of computing units 14 disposed in the rack 12 of the computing system 10.

The outlet heat exchanger 114 can be operable to receive the fluid from the liquid cooled computing unit 14 (e.g., via inlet ports 314), lower the temperature of the fluid, and provide the fluid to the pump unit 200 (for example via the fluid coupling of output 310 of the output heat exchanger 114 with the inlet 210 of the pump unit 200). The inlet ports 314 can correspond with each of the computing units 14 in the computing system 10. For example, the inlet ports 314 can be aligned with a corresponding plurality of computing units 14 disposed in the rack 12 of the computing system 10.

Figure 4A:
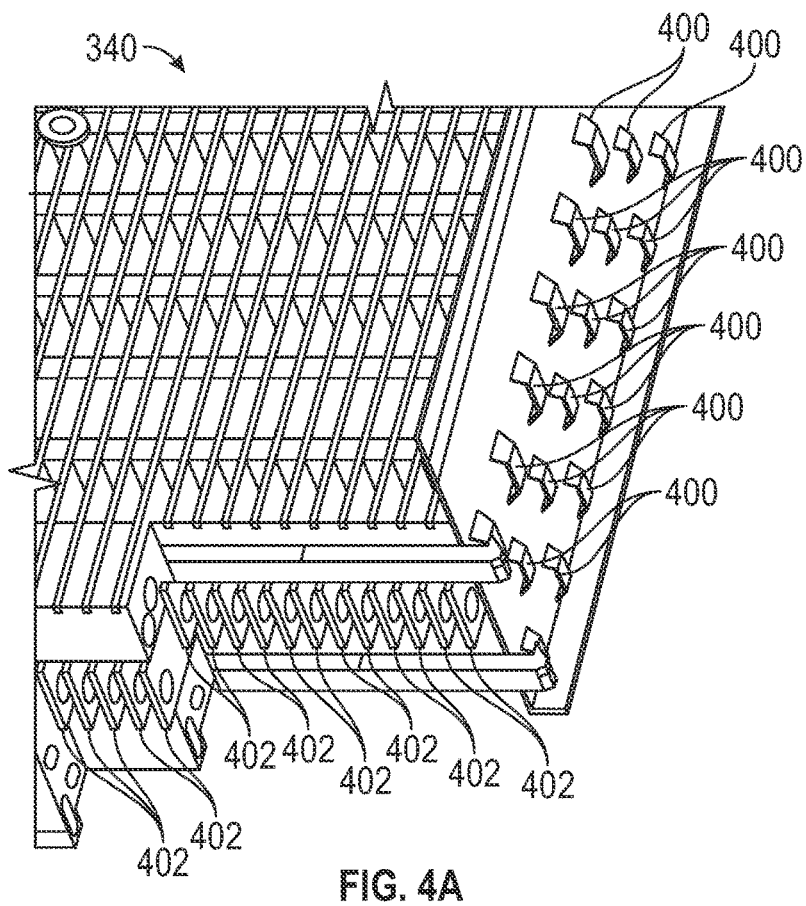
FIG. 4A is a detailed view of a heat exchange core.
Figure 4B:
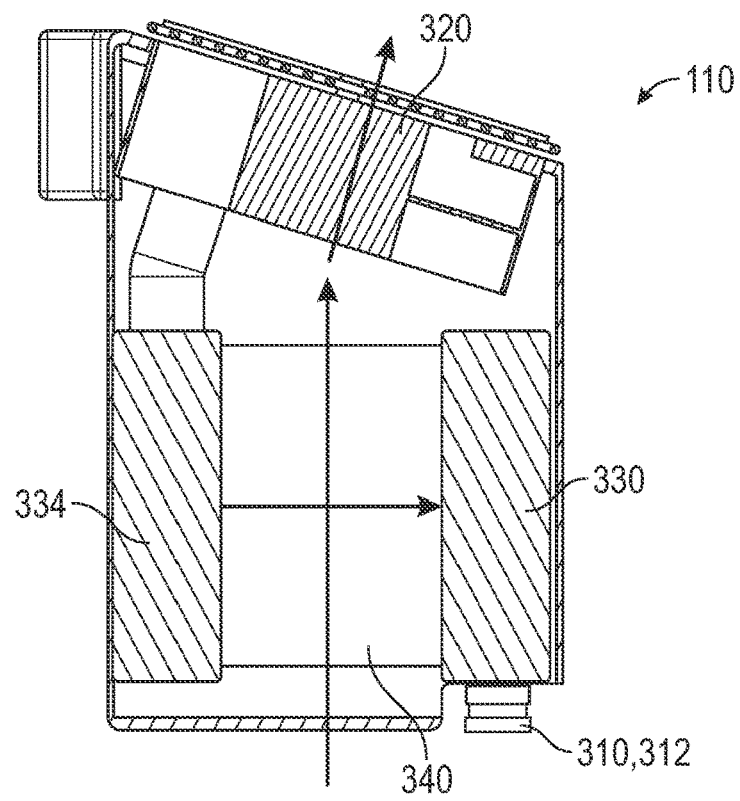
FIG. 4B is a diagram of a top view of the heat exchange core.

As illustrated in FIGS. 3B and 4B, in at least one example, the heat exchangers 110 can each include a plurality of fans 320. The plurality of fans 320 are operable to create air flow across a heat exchange core 340 to lower the temperature of the fluid.

Referring to FIG. 3C, the plurality of heat exchangers 110 (e.g., the input heat exchanger 112 and the outlet heat exchanger 114) can each include an inside manifold 330, an outside manifold 334, and a heat exchange core 340 fluidly connecting the inside manifold 330 and the outside manifold 334. The inside manifold 331 of the input heat exchanger 112 can be fluidly coupled with the input 312. Accordingly, the fluid can flow from the pump unit 200 into the input heat exchanger 112 via the input 312, and down into the inside manifold 331. As the inside manifold 331 fills with fluid, the fluid can flow across the heat exchange core 340 of the input heat exchanger 112 to the outside manifold 336 of the input heat exchanger 112. As the fluid flows across the heat exchange core 340, the temperature of the fluid is lowered. As the outside manifold 336 fills with the fluid, the fluid can flow out of the outlet ports 313 to the plurality of computing units 14.

From the computing units 14, the fluid can flow from the computing units 14 into the outside manifold 335 of the outlet heat exchanger 114 via the inlet ports 314. As the outside manifold 335 of the outlet heat exchanger 114 fills with the fluid, the fluid flows across the heat exchange core 340 to the inside manifold 332 of the outlet heat exchanger 114. As the fluid flows across the heat exchange core 340, the temperature of the fluid is lowered. The fluid then flows from the inside manifold 332 of the outlet heat exchanger 114 to the pump unit 200 via the output 310.

While the disclosure discusses the pump unit 200 being fluidly coupled with the inside manifolds 330 of the heat exchangers 110, in some examples, the pump unit 200 can be fluidly coupled with the outside manifolds 334. In some examples, the inside manifold 331 of the input heat exchanger 112 can be fluidly coupled with the pump unit 200 while the outside manifold 335 of the outlet heat exchanger 114 can be fluidly coupled with the pump unit 200. In some examples, the outside manifold 336 of the input heat exchanger 112 can be fluidly coupled with the pump unit 200 while the inside manifold 332 of the outlet heat exchanger 114 can be fluidly coupled with the pump unit 200.

FIGS. 4A and 4B illustrate the heat exchange core 340 included in the heat exchangers 110. In at least one example, for example as illustrated in FIG. 4A, the heat exchange core 340 can include a plurality of tubes 400 that fluidly connect the inside manifold 330 and the outside manifold 334. The fluid can flow into the tubes 400 to flow between the inside manifold 330 and the outside manifold 334. A plurality of cooling fins 402 transfer heat from the fluid in the tubes 400 to the air flowing across the cooling fins 402, as shown in FIG. 4B. The fans 320 pull the air across the cooling fins 402 and out of the heat exchangers 110 of the rack mounted cooling system 100 away from the computing system 10.

Figure 5A:
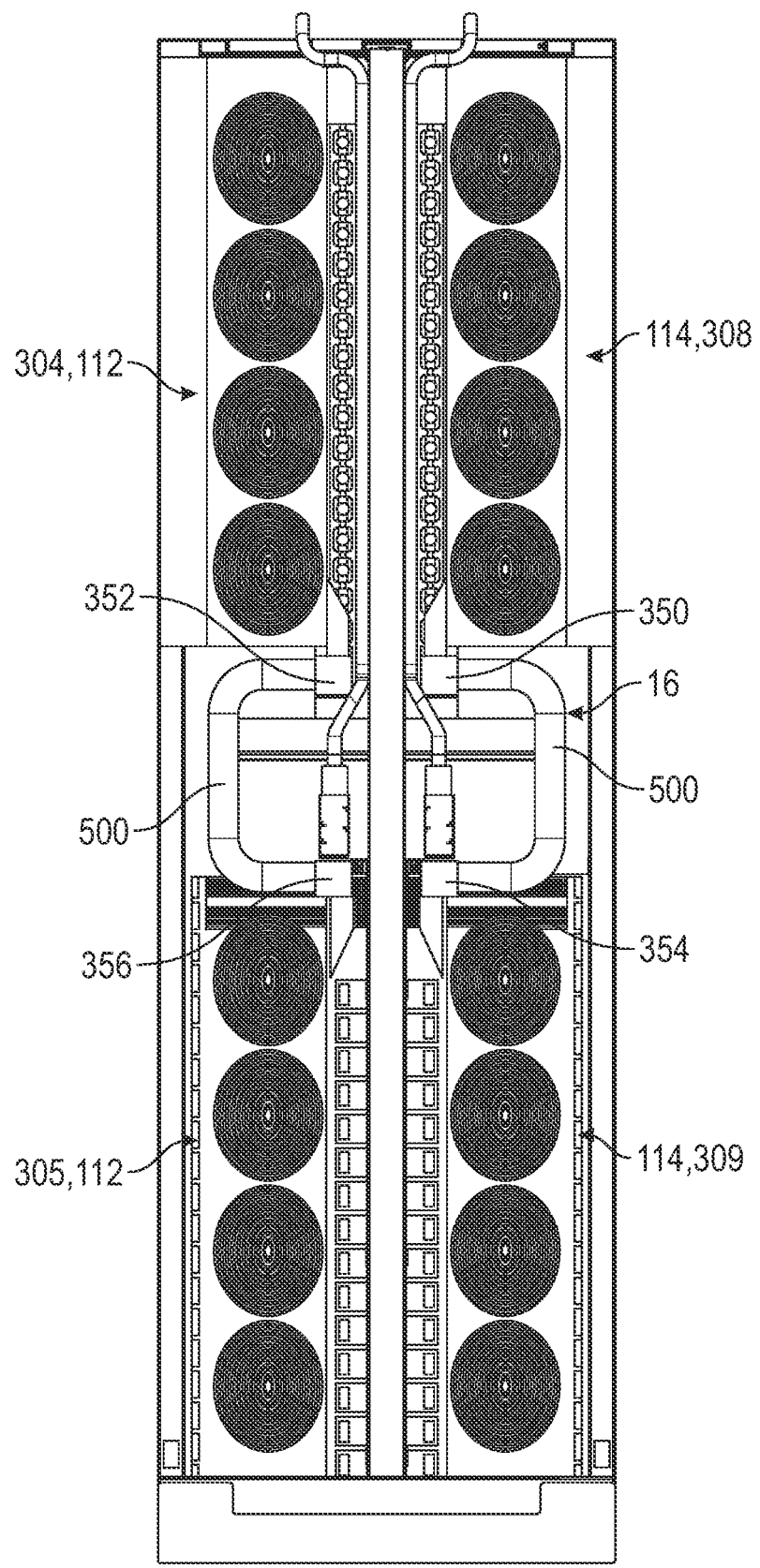
FIG. 5A is a rear view of the computing system.

In at least one example, referring to FIG. 5A, the input heat exchanger 112 can include an upper input heat exchanger 304 and a lower input heat exchanger 305, and the outlet heat exchanger 114 can include an upper outlet heat exchanger 308 and a lower outlet heat exchanger 309. The upper input heat exchanger 304 and the lower input heat exchanger 305, and similarly the upper outlet heat exchanger 308 and the lower outlet heat exchanger 309, can be separated to provide access to the hardware components 16. As the hardware components 16 may be provided in between rows of computing units 14, the hardware components 16 split the computing system 10 into an upper section and a lower section of computing units 14.

As the pump unit 200 in the present disclosure is provided at the top of the rack 12, the upper input heat exchanger 304 directly couples with the pump unit 200 and is positioned above the lower input heat exchanger 309. Referring to FIGS. 3C and 5A-6C, the upper input heat exchanger 304 can be fluidly coupled with the lower input heat exchanger 305 such that the fluid is operable to flow from the upper input heat exchanger 304 to the lower input heat exchanger 305. In at least one example, the upper input heat exchanger 304 can be fluidly coupled with the lower input heat exchanger 305 via a hose assembly 500. For example, the upper input heat exchanger 304 can include a lower connector 350 that is operable to fluidly couple with the hose assembly 500. Opposite the lower connector 350, the hose assembly 500 can be fluidly coupled with the upper connector 354 of the lower input heat exchanger 305. Accordingly, the hose assembly 500 fluidly couples the upper input heat exchanger 304 with the lower input heat exchanger 305 via the lower connector 350 and the upper connector 354.

Similarly, the upper outlet heat exchanger 308 can be fluidly coupled with the lower outlet heat exchanger 309 such that the fluid is operable to flow from the lower outlet heat exchanger 309 to the upper outlet heat exchanger 308. In at least one example, the lower outlet heat exchanger 309 can be fluidly coupled with the upper outlet heat exchanger 308 via a hose assembly 500. For example, the lower outlet heat exchanger 309 can include an upper connector 356 that is operable to fluidly couple with the hose assembly 500. Opposite the upper connector 356, the hose assembly 500 can be fluidly coupled with the lower connector 352 of the upper outlet heat exchanger 308. Accordingly, the hose assembly 500 fluidly couples the lower outlet heat exchanger 309 with the upper outlet heat exchanger 308 via the upper connector 356 and the lower connector 352.

Figure 5B:
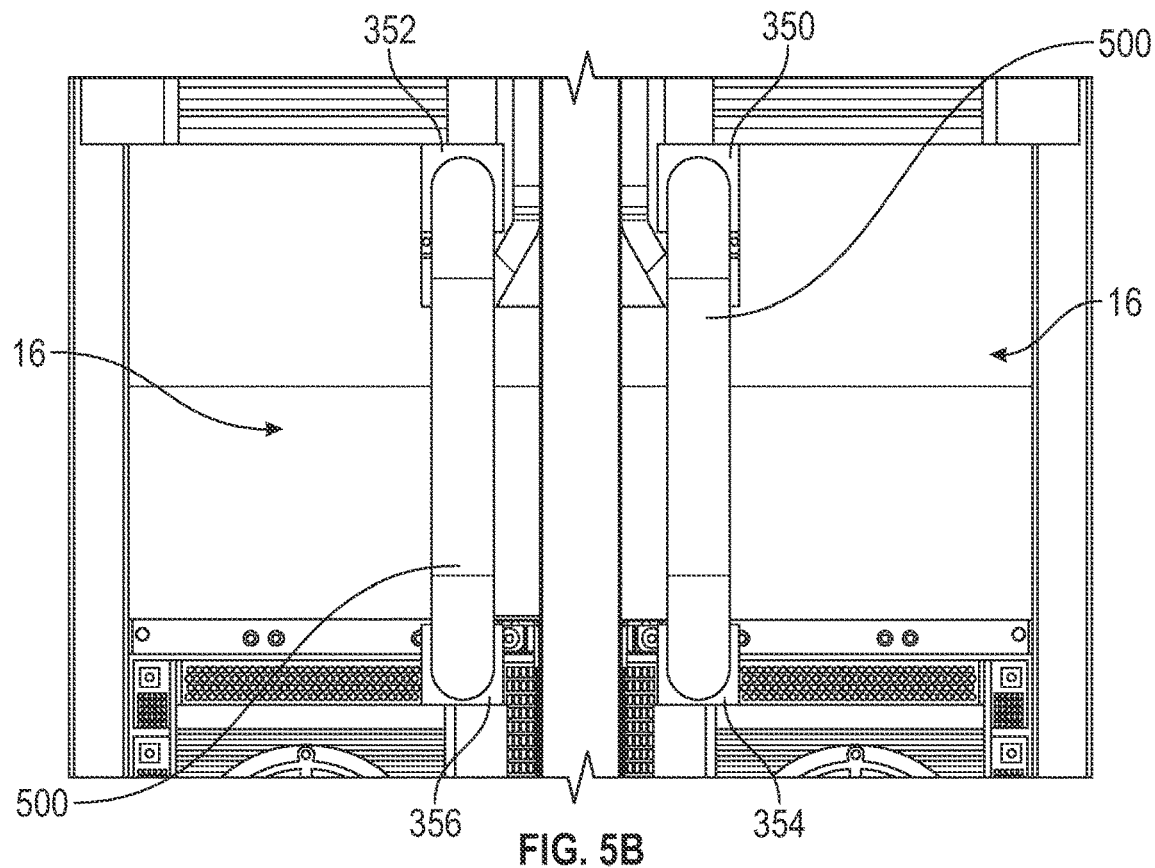
FIG. 5B is an enlarged view of the computing system, showing a hose assembly in another configuration.

As illustrated in FIGS. 5A and 5B, in at least one example, the hose assembly 500 is operable to swivel to provide access to the components (e.g., the hardware components 16) of the computing system 10. In some examples, the hose assembly 500 being configured to swivel can keep the hose assembly 500 within the volume or footprint of the rack 12 (in some examples conventional rack).

Figure 6A:
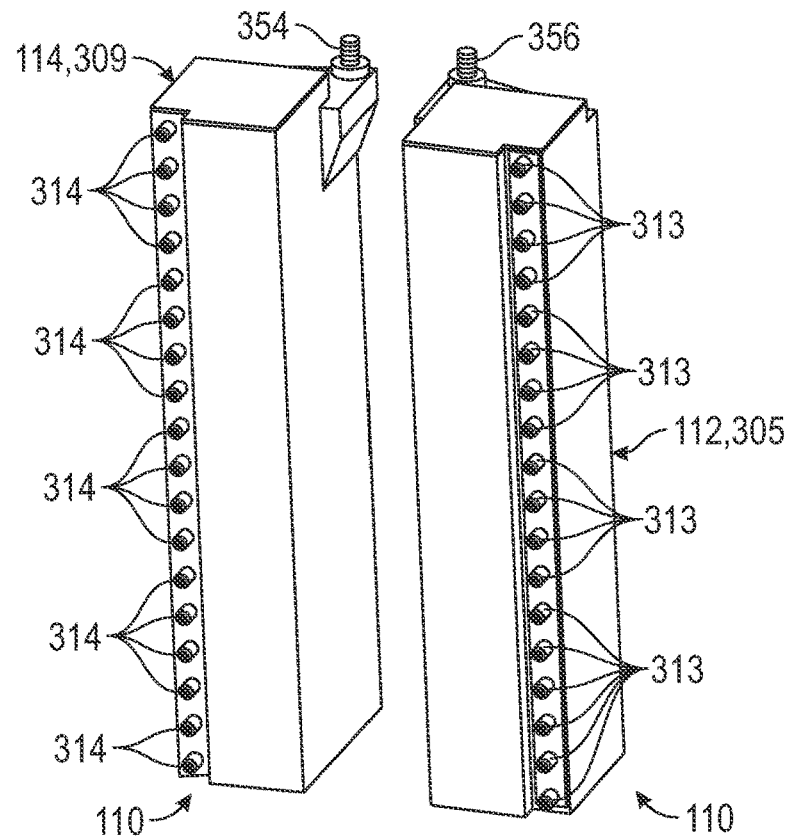
FIG. 6A is a perspective view of a lower heat exchange of the rack mounted cooling system.

FIGS. 6A-6C illustrate the lower input heat exchanger 305 and the lower outlet heat exchanger 309. Similar to the upper input heat exchanger 304 and the upper outlet heat exchanger 308, the lower input heat exchanger 305 and the lower outlet heat exchanger 309 can each include an inside manifold 330, a heat exchange core 340, and an outside manifold 334. As the fluid flows across the heat exchange core 340, the temperature of the fluid is lowered due to the fans 320 creating air flow across the heat exchange core 340.

Referring to FIG. 6C, the inside manifold 331 of the lower input heat exchanger 305 can be fluidly coupled with the upper connector 356. Accordingly, the fluid can flow from the upper input heat exchanger 304 into the lower input heat exchanger 305 via the hose assembly 500 and the upper connector 356, and down into the inside manifold 331. As the inside manifold 331 fills with fluid, the fluid can flow across the heat exchange core 340 of the input heat exchanger 112 to the outside manifold 336 of the lower input heat exchanger 305. As the fluid flows across the heat exchange core 340, the temperature of the fluid is lowered. As the outside manifold 336 fills with the fluid, the fluid can flow out of the outlet ports 313 to the plurality of computing units 14.

From the computing units 14, the fluid can flow from the computing units 14 into the outside manifold 335 of the lower outlet heat exchanger 309 via the inlet ports 314. As the outside manifold 335 of the lower outlet heat exchanger 309 fills with the fluid, the fluid flows across the heat exchange core 340 to the inside manifold 332 of the lower outlet heat exchanger 309. As the fluid flows across the heat exchange core 340, the temperature of the fluid is lowered. The fluid then flows from the inside manifold 332 of the lower outlet heat exchanger 309 to the upper outlet heat exchanger 308 via the upper connector 354.

While the disclosure discusses the upper connectors 356, 354 being fluidly coupled with the inside manifolds 330 of the lower input heat exchanger 305 and the lower outlet heat exchanger 309, in some examples, the upper input heat exchanger 304 and the upper outlet heat exchanger 308 can be fluidly coupled with the outside manifolds 334. In some examples, the inside manifold 331 of the lower outlet heat exchanger 309 can be fluidly coupled with the upper connector 356 while the outside manifold 335 of the lower outlet heat exchanger 309 can be fluidly coupled with the upper connector 354. In some examples, the outside manifold 336 of the lower input heat exchanger 305 can be fluidly coupled with the upper connector 356 while the inside manifold 332 of the lower outlet heat exchanger 309 can be fluidly coupled with the upper connector 354.

As illustrated in FIG. 7, the fluid can flow from the input heat exchangers 112, to the computing units 14 to lower the temperature of the computing units 14, and back to the outlet heat exchangers 114. The fluid can flow from the outlet ports 313 to conduit 701. The fluid then flows to cool components (for example CPU, GPU, etc.) of the computing unit 14 via heat sinks. For example, the fluid flows from conduit 701 to heat sink 702. The fluid then flows from the heat sink 702 to heat sink 704 via conduit 703. The fluid can then flow from heat sink 704 to conduit 705 which is fluidly coupled with outlet port 314. The fluid can then flow to the outlet heat exchangers 114.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A rack mounted cooling system operable to cool a computing system, the rack mounted cooling system comprising:
   a pump unit operable to pump fluid; and
   a plurality of heat exchangers including:
      an input heat exchanger operable to receive the fluid from the pump unit, lower a temperature of the fluid, and provide the fluid to a liquid cooled computing unit; and
      an outlet heat exchanger operable to receive the fluid from the liquid cooled computing unit, lower the temperature of the fluid, and provide the fluid to the pump unit,
   wherein the plurality of heat exchangers are operable to be coupled to a rack of the computing system such that the rack with the plurality of heat exchangers fits within a rack keep in area.

2. The rack mounted cooling system of claim 1, wherein the plurality of heat exchangers are operable to be retrofit to a conventional rack for the computing system.

3. The rack mounted cooling system of claim 1, wherein the pump unit includes at least one pump module, wherein the at least one pump module is removable.

4. The rack mounted cooling system of claim 1, wherein the pump unit includes a plurality of pump modules, wherein each of the pump modules are removable.

5. The rack mounted cooling system of claim 1, wherein the pump unit includes an internal heat exchanger and at least one fan operable to lower the temperature of the fluid.

6. The rack mounted cooling system of claim 1, wherein the input heat exchanger includes an upper input heat exchanger and a lower input heat exchanger, wherein the upper input heat exchanger is fluidly coupled with the lower input heat exchanger, wherein the fluid is operable to flow from the upper input heat exchanger to the lower input heat exchanger.

7. The rack mounted cooling system of claim 6, wherein the upper input heat exchanger is fluidly coupled with the lower input heat exchanger via a hose assembly, wherein the hose assembly is operable to swivel to provide access to components of the computing system.

8. The rack mounted cooling system of claim 1, wherein the outlet heat exchanger includes an upper outlet heat exchanger and a lower outlet heat exchanger, wherein the lower outlet heat exchanger is fluidly coupled with the upper input heat exchanger, wherein the fluid is operable to flow from the lower outlet heat exchanger to the upper input heat exchanger.

9. The rack mounted cooling system of claim 8, wherein the upper outlet heat exchanger is fluidly coupled with the lower outlet heat exchanger via a hose assembly, wherein the hose assembly is operable to swivel to provide access to components of the computing system.

10. The rack mounted cooling system of claim 1, wherein the plurality of heat exchangers each include an inside manifold, an outside manifold, and a heat exchange core fluidly connecting the inside manifold and the outside manifold.

11. The rack mounted cooling system of claim 10, wherein the heat exchange core includes a plurality of passageways such that the fluid flows across the heat exchange core between the inside manifold and the outside manifold.

12. The rack mounted cooling system of claim 10, wherein the rack mounted cooling system further comprises a plurality of fans operable to provide air flow across the heat exchange core to lower the temperature of the fluid passing through the heat exchange core.

13. The rack mounted cooling system of claim 1, wherein the input heat exchanger includes a plurality of input ports that are aligned with a corresponding plurality of computing units disposed in the rack of the computing system, wherein the outlet heat exchanger includes a plurality of outlet ports that are aligned with the corresponding plurality of computing units disposed in the rack of the computing system.

14. A computing system comprising:
a plurality of computing units;
a rack operable to receive the plurality of computing units;
a rack mounted cooling system operable to cool the plurality of computing units, the rack mounted cooling system including:
a pump unit operable to pump fluid; and
a plurality of heat exchangers including:
an input heat exchanger operable to receive the fluid from the pump unit, lower a temperature of the fluid, and provide the fluid to a liquid cooled computing unit; and
an outlet heat exchanger operable to receive the fluid from the liquid cooled computing unit, lower the temperature of the fluid, and provide the fluid to the pump unit,
wherein the rack mounted cooling system is operable to be coupled to the rack of the computing system such that the rack with the rack mounted cooling system fits within a rack keep in area.

15. The computing system of claim 14, wherein the rack is a conventional rack, wherein the plurality of heat exchangers is operable to be retrofit to the conventional rack.

16. The computing system of claim 14, wherein the pump unit includes a plurality of pump modules, wherein each of the pump modules are removable.

17. The computing system of claim 14,
wherein the input heat exchanger includes an upper input heat exchanger and a lower input heat exchanger, wherein the upper input heat exchanger is fluidly coupled with the lower input heat exchanger, wherein the fluid is operable to flow from the upper input heat exchanger to the lower input heat exchanger, and
wherein the outlet heat exchanger includes an upper outlet heat exchanger and a lower outlet heat exchanger, wherein the lower outlet heat exchanger is fluidly coupled with the upper input heat exchanger, wherein the fluid is operable to flow from the lower outlet heat exchanger to the upper input heat exchanger.

18. The computing system of claim 17, wherein the upper input heat exchanger is fluidly coupled with the lower input heat exchanger via a hose assembly, wherein the hose assembly is operable to swivel to provide access to components of the computing system, and
wherein the upper outlet heat exchanger is fluidly coupled with the lower outlet heat exchanger via a hose assembly, wherein the hose assembly is operable to swivel to provide access to components of the computing system.

19. The computing system of claim 14, wherein the plurality of heat exchangers each include an inside manifold, an outside manifold, and a heat exchange core fluidly connecting the inside manifold and the outside manifold, wherein the rack mounted cooling system further comprises a plurality of fans operable to provide air flow across the heat exchange core to lower the temperature of the fluid passing through the heat exchange core.

20. The computing system of claim 14, wherein the input heat exchanger includes a plurality of input ports that are aligned with a corresponding plurality of computing units disposed in the rack of the computing system, wherein the outlet heat exchanger includes a plurality of outlet ports that are aligned with the corresponding plurality of computing units disposed in the rack of the computing system.

* * * * *